United States Patent [19]
Kitayama et al.

[11] Patent Number: 5,744,382
[45] Date of Patent: Apr. 28, 1998

[54] METHOD OF PACKAGING ELECTRONIC CHIP COMPONENT AND METHOD OF BONDING OF ELECTRODE THEREOF

[75] Inventors: Yoshifumi Kitayama, Hirakata; Kazuhiro Mori, Katano; Keiji Saeki, Kobe; Takashi Akiguchi, Osaka, all of Japan

[73] Assignee: Matsushita Electric Industrial Co., Ltd., Kadoma, Japan

[21] Appl. No.: 703,879

[22] Filed: Aug. 27, 1996

Related U.S. Application Data

[62] Division of Ser. No. 193,359, Feb. 3, 1994, abandoned, which is a continuation of Ser. No. 882,131, May 13, 1992, abandoned.

[51] Int. Cl.$^6$ .................................................. H01L 21/44
[52] U.S. Cl. ...................... 438/106; 438/127; 438/613; 438/614
[58] Field of Search .................................. 438/106, 108, 438/110, 112, 127, 613, 614

[56] References Cited

U.S. PATENT DOCUMENTS

| | | |
|---|---|---|
| 4,523,372 | 6/1985 | Balda . |
| 4,652,598 | 3/1987 | Edelman . |
| 4,901,133 | 2/1990 | Curran et al. . |
| 4,907,064 | 3/1990 | Yamazaki et al. . |
| 4,913,930 | 4/1990 | Getson . |
| 4,950,623 | 8/1990 | Dishon .................................... 438/614 |
| 4,963,405 | 10/1990 | Yamashita et al. . |
| 5,139,610 | 8/1992 | Dunaway et al. ...................... 438/613 |
| 5,244,833 | 9/1993 | Gansauge et al. ..................... 438/613 |
| 5,393,697 | 2/1995 | Chang et al. ............................ 438/613 |
| 5,436,198 | 7/1995 | Shibata ................................... 438/613 |
| 5,496,770 | 3/1996 | Park ....................................... 438/613 |
| 5,587,337 | 12/1996 | Idaka et al. ............................. 438/613 |

*Primary Examiner*—John Niebling
*Assistant Examiner*—Michael S. Lebentritt
*Attorney, Agent, or Firm*—Wenderoth, Lind & Ponack

[57] ABSTRACT

An electronic chip component includes an electrode formed on a wafer, a passivation film formed on the wafer, and an organic protective film covering an entire surface of exposed portions of the electrode and the passivation film. Such component is packed in a package including a carrier tape having therethrough a space for receiving the component with one end of such space open. A cover is applied to close the open end of the space after the component is inserted therein.

24 Claims, 4 Drawing Sheets

METHOD OF PACKAGING ELECTRONIC CHIP COMPONENT AND METHOD OF BONDING OF ELECTRODE THEREOF

This is a divisional application of Ser. No. 08/193,359, filed Feb. 3, 1994, now abandoned, which is a continuation of Ser. No. 07/882,131, filed May 13, 1992, now abandoned.

BACKGROUND OF THE INVENTION

The present invention relates to a method for packing an electronic chip component by means of tape and to a method of bonding an electrode thereof.

A conventional method for packing an electronic chip component by means of a tape is described below with reference to FIG. 8. A wafer is divided into a plurality of electronic chip components by dicing. Each component 41 is stored in a respective hole 45 of a carrier tape main body 42 to which a bottom tape 43 is attached. A top tape 44 then is adhered to the carrier tape main body 42 so as to seal the hole 45. Electronic chip component 41 has an active surface 46 having an electrode 47 formed thereon. The wafer and chip are covered with a passivation film 48 made of silicon dioxide or silicon nitride except for a portion or portions 47 of the chip component to be attached to external electrodes. The passivation film 48 imparts moisture resistance to the electronic chip component 41.

A disadvantage of such conventional method is that the active surface 46 of the electronic chip component 41 is partially exposed to the air. Further, the active surface 46 may be damaged or chipped when the electronic chip component 41 contacts the inner surface of the top tape 44 or the inner surface of the hole 45 as a result of movement of the electronic chip component 41 in the hole 45 after the electronic chip component 41 is taped. Since the electrode portion 47 is in contact with the air, electrode portion 47 becomes oxidized, which causes corrosion.

Moreover, pin holes may be formed in the passivation film 48. Accordingly, the resistance of the electronic chip component 41 to moisture may be insufficient.

SUMMARY OF THE INVENTION

It is an object of the present invention to provide a method of packing an electronic chip component which prevents an active surface from being damaged or chipped, an electrode portion thereof from being oxidized, or a pin hole in a passivation film thereof from remaining exposed, and to a method for bonding the electrode portion of the electronic chip component.

In accomplishing this and other objects according to the present invention, there is provided an electronic chip component including an electrode formed on a wafer, a passivation film formed on the wafer, and an organic protective film covering entire surfaces of exploded portions of the electrode and the passivation film.

According to an aspect of the present invention, there is provided a method for packing such electronic chip component by the steps of inserting the component into a space in a carrier tape main body with one end of the space open, and then closing the open end of the space with a cover tape.

According to the above features of the invention, even though the electronic chip component having the organic protective film formed on the active surface thereof and stored in the space of the carrier tape is moved, when the active surface collides with the cover tape, the organic protective film protects the active surface because of its cushioning function. The organic protective film also shields the active surface from the air. Therefore, the electrode disposed on the active surface can be prevented from being oxidized, and moisture can be prevented from permeating into the electronic chip component. Since the organic protective film is formed on the wafer, the electronic chip component can be produced at a high production efficiency. In addition, only a portion of the organic film is destroyed in a subsequent process of use of the chip component. Thus, a good electrical connection can be made. Since the organic protective film protects the active surface of the electronic chip component from the air, the electrode can be prevented from being oxidized. Since the organic protective film covers any pin holes in the passivation film, moisture is prevented from permeating into the electronic chip component through such pin holes. A part of the organic protective film corresponding to the part of the electrode to be connected to an external electrode is destroyed by pressing, e.g. a metal wire having a spherical leading end, with a bonding tool. Thereby, the metal wire can be bonded with the electrode of the electronic chip component under pressure. Accordingly, a metal bump easily can be formed on the electrode or the metal wire easily can be bonded with the electrode of the electronic chip component.

According to the present invention, a metal bump may be formed on the wafer, and all exposed surfaces of the passivation film, the electrode and the bump are covered with the organic protective film, and the wafer is diced into a plurality of electronic chip components. The organic protective film protects the surfaces of the wafer, the electrode and the metal bump against the air. Accordingly, the electrode can be prevented from being oxidized and moisture can be prevented from permeating into the electronic chip component. According to this embodiment of the present invention, a portion of the organic protective film corresponding only to a bonding portion between the metal bump and an external electrode easily can be destroyed by compressing such film portion to bond the external electrode to the metal bump. Further, even if the external electrode contacts an edge portion of the electronic chip component, the organic protective film prevents the generation of a short circuit due to its electrical insulating function.

BRIEF DESCRIPTION OF THE DRAWINGS

These and other objects and features of the present invention will become clear from the following description of preferred embodiments thereof with reference to the accompanying drawings, in which.

DETAILED DESCRIPTION OF THE INVENTION

Figure 1:
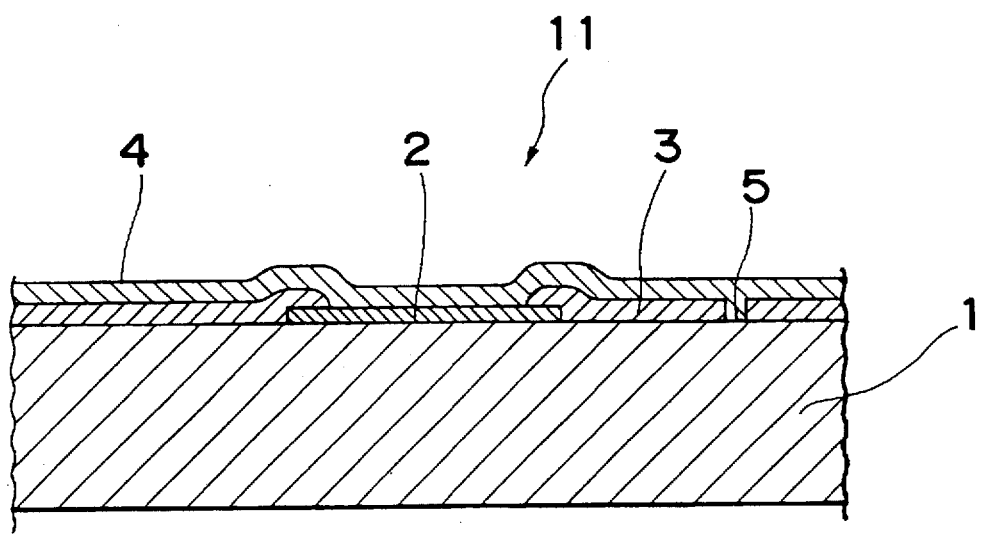
FIG. 1 is a sectional view of a portion of a wafer employed in the methods of the present invention.

Before the description of the present invention proceeds, it is to be noted that like parts are designated by like reference numerals throughout the accompanying drawings.

Figure 2:
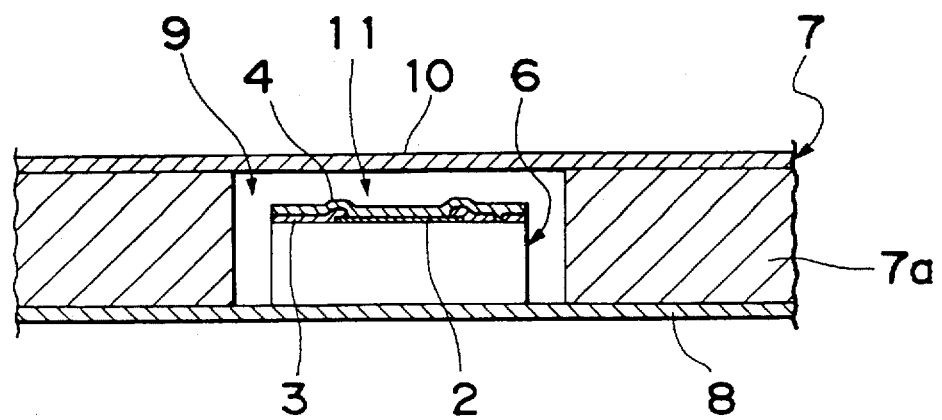
FIG. 2 is a sectional view showing such an electronic chip component after being packed according to the invention.

Referring to FIGS. 1 and 2, an embodiment of an electronic chip component and a method of packing thereof are described below.

FIG. 1 shows a wafer 1 to be formed into plural electronic chip components. An aluminum electrode member 2 for each component to be formed (only one shown in FIG. 1) is formed on an active surface 11 of wafer 1. A center portion of the aluminum electrode 2, to connect the respective electronic chip component with an external electrode, is exposed to the air while the periphery of the aluminum electrode 2 in the horizontal direction thereof and the surface of the wafer 1 are covered with a passivation film 3, of a thickness of 0.8 to 1.3 cm, comprising silicon dioxide or silicon nitride so that the wafer 1 is resistant to moisture. That is, film 3 forms a moisture barrier. After the passivation film 3 is formed, the exposed portion of the aluminum electrode 2 and the passivation film 3 are covered with polyimide solution by means of spin coating so as to cover the surface of the wafer 1 with the polyimide solution of the same thickness. Then, the polyimide solution is heated for one to three hours at 100°–150° C. to harden the polyimide. As a result, an organic protective film 4 is formed on the surface of the exposed portion of the aluminum electrode 2 and the passivation film 3. A pin hole 5 may be formed in the passivation film 3, but the polyimide solution penetrates into the pin hole 5, thus filling pin hole 5. Therefore, active surface 11 of the wafer 1 is entirely covered and protected from the air by the organic protective film 4. That is, film 4 forms an air barrier.

Instead of polyimide, depending on the particular is electronic chip component, the organic protection film 4 may be made of a thermosetting organic substance or a thermoplastic organic substance such as polyurethane, polyphenylene sulfide or epoxy resin having high electrical insulating properties and applied by a suitable film forming method or under suitable conditions.

After the wafer 1 is covered with the organic protective film 4, the wafer 1 is diced into a plurality of electronic chip components 6. The outer surface of film 4 of each component 6 is entirely exposed and uncovered.

As shown in FIG. 2, a carrier tape 7 includes a bottom tape 8 made of polyester and adhered to the main body 7a consisting of polystyrene. An electronic chip component 6 is stored in a hole 9 formed through main body 7a, with tape 8 sealing the bottom of hole 9. Thereafter, a top tape 10 made of polyester is adhered to the carrier tape main body 7a so as to seal the top of hole 9. Thus, the electronic chip component 6 is packed in the carrier tape 7. The bottom tape 8 and the top tape 10 are formed of resin films. Not only polystyrene and polyester, but also a material having a resistivity value of $10^4 \Omega$ cm to $10^6 \Omega$ cm may be used as the carrier tape main body 7a.

Even if the electronic chip component 6 having the active surface 11 thereof covered with the organic protective film 4, stored in the hole 9 of the carrier tape 7 is moved in the hole 9 and contacts the inner surface of the top page 10 or the inner surface of the main body 7a defining hole 9, the active surface 11 of the electronic chip component 6 is not damaged or chipped because the active surface 11 is protected by the organic protective film 4.

Since the organic protective film 4 protects the active surface 11 against the air, the aluminum electrode 2 can be prevented from being oxidized, and at the same time moisture can be prevented from permeating into the electronic chip component 6. That is, the electronic chip component 6 is resistant to oxidation and moisture.

The organic protective film 4 does not have a mechanical strength sufficient to withstand the heat and the pressure applied thereto when the electronic chip component 6 is bonded into a circuit board. Accordingly, the portion of the organic protective film 4 corresponding to the electrode 2 is destroyed when the electrode 2 is bonded with a metal wire of the circuit board. It is easy to destroy the portion of the organic protective film 4 necessary for bonding the metal wire with the electrode 2. Therefore, the organic protective film 4 is preferable for use in an electronic chip component which is bonded with a metal wire in a subsequent process.

According to the invention, even though the active surface of the electronic chip component contacts an inner surface of the space accommodated within the carrier tape main body or an inner surface of the top tape, the active surface of the electronic chip component will be prevented from being damaged or chipped. In addition, the electronic chip component is resistant to oxidation and moisture. Thus, the electronic chip component is reliable and easily can be bonded with the metal wire.

Figure 3:
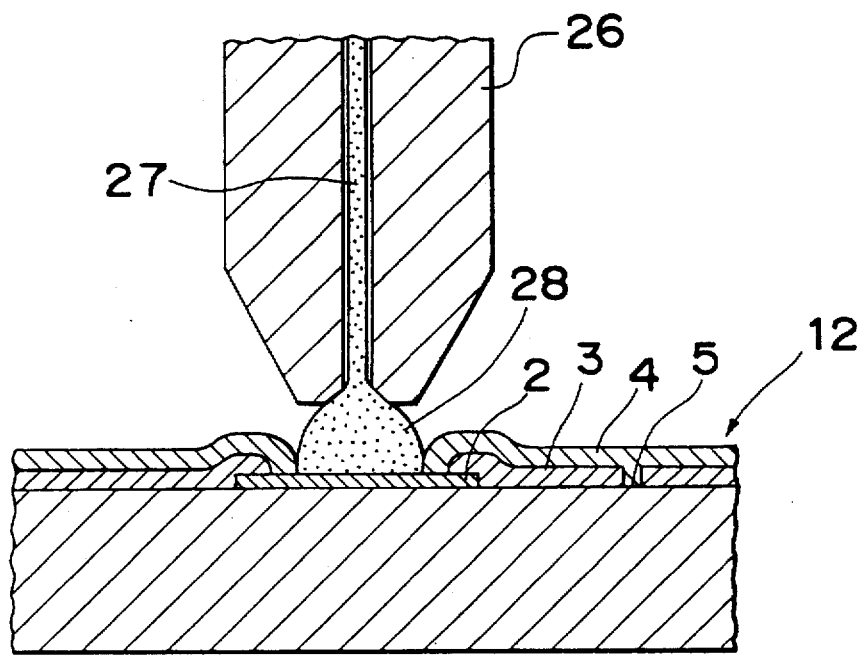
FIG. 3 is a sectional view showing formation on an electrode of an electronic chip component of a metal bump according to the present invention.
Figure 4:
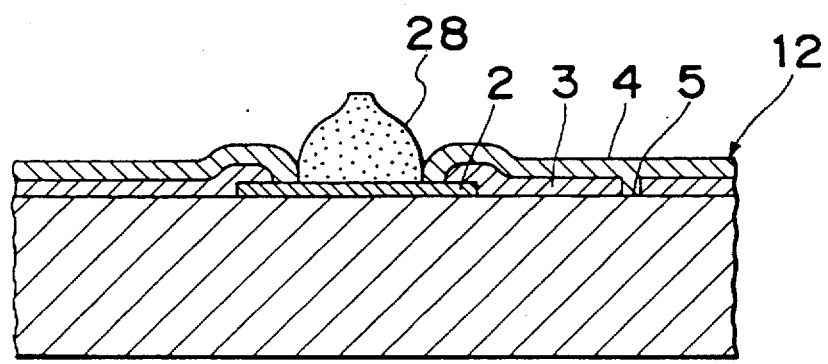
FIG. 4 is a sectional view showing the electronic chip component with the metal bump formed therein.

FIGS. 3 and 4 show a process of connecting an external electrode in the form of a metal bump on an electronic chip component 12 formed by dicing the wafer 1 covered with the organic protective film 4 as described above.

Referring to FIG. 3, a metal wire 27 having a ball 28 formed on the leading end thereof is disposed above the electrode 2 of the electronic chip component 12 by means of a capillary (bonding tool) 26 while the wire 27 is hold by the bonding tool 26. Then, the capillary 26 is moved downward to press the organic protective film 4, and the organic protective film 4 is heated at 400° to 500° C. with a pressure of 50 to 100 g applied thereto per bump or per wire. As a result, the organic protective film 4 disposed on the electrode 2 and pressed by the ball 28 is destroyed locally and the ball 28 is crushed by the edge of the capillary 26. Consequently, the ball 28 is bonded with the electrode 2 under pressure. In destroying the protective film 4, the organic protective film 4 may be heated at 150° to 300° C. with ultrasonic energy applied thereto as necessary. After the ball 28 is bonded with the electrode 2 under pressure, the capillary 26 is moved upward to pull the metal wire 27 so as to cut the metal wire 27 from the ball 28. Thus, as shown in FIG. 4, the ball 28 forms a metal bump on the electrode 2.

Figure 5:
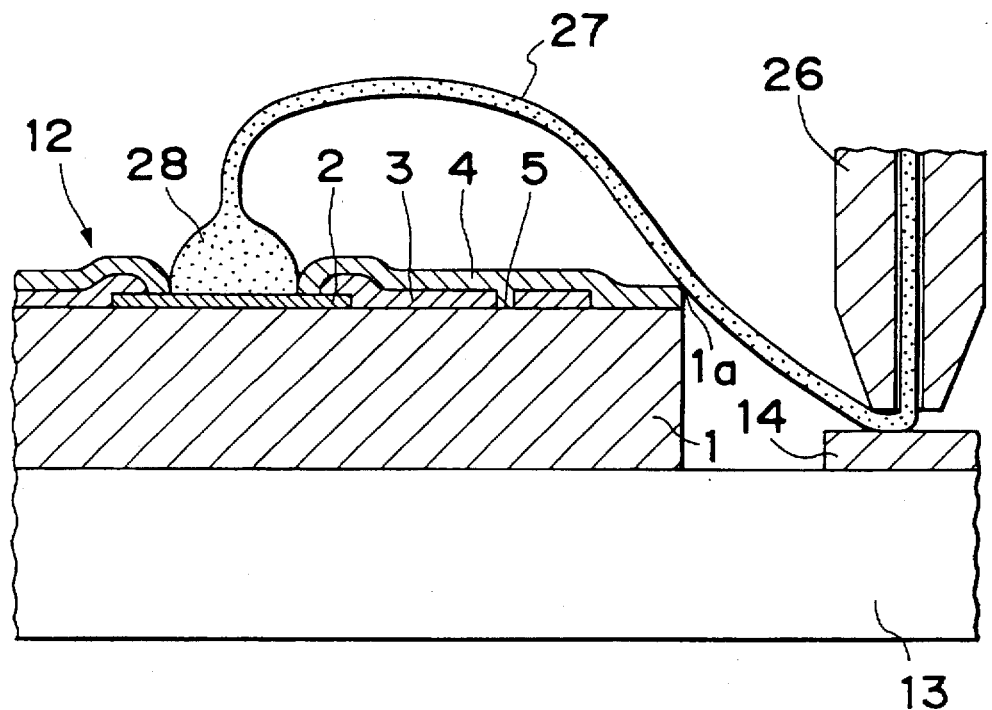
FIG. 5 is a sectional view showing bonding of an electrode of an electronic chip component with another metal bump according to the present invention.

FIG. 5 show a process of wire-bonding the electronic chip component 12 with a circuit board 13. Referring to FIG. 5, the ball 28 disposed at the leading end of the metal wire 27 destroys the organic protective film 4 and is bonded with the electrode 2 under pressure by a method similar to that shown in FIG. 4. Thereafter, the metal wire 27 is stretched by the movement of the capillary 26 and then is bonded under pressure with a land 14 disposed on the circuit board 13.

Figure 6:
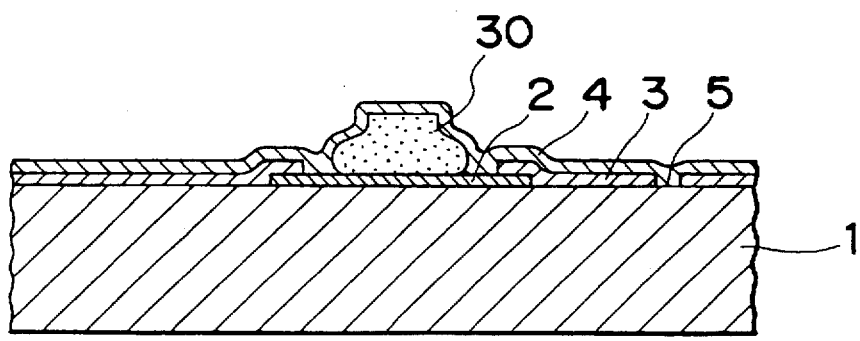
FIG. 6 is a sectional view showing another wafer employed according to the present invention.
Figure 7:
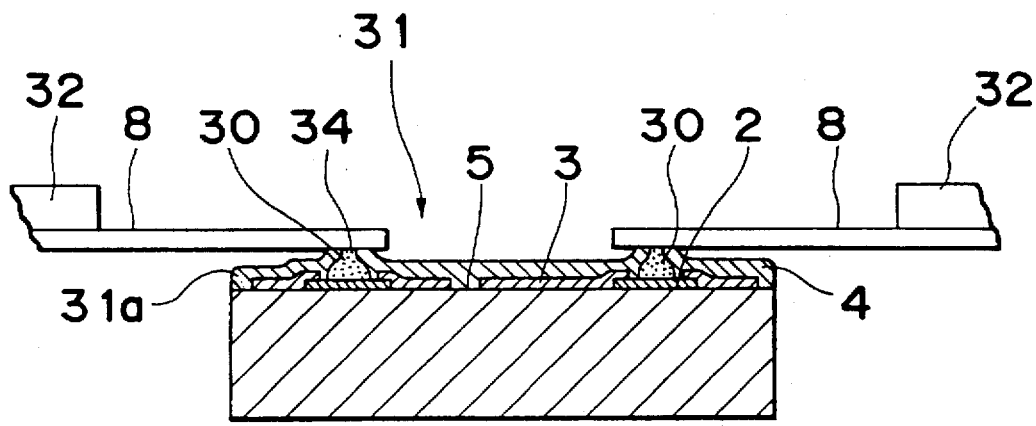
FIG. 7 is a sectional view showing bonding of an electronic chip component with a TAB tape according to the present invention.
Figure 8:
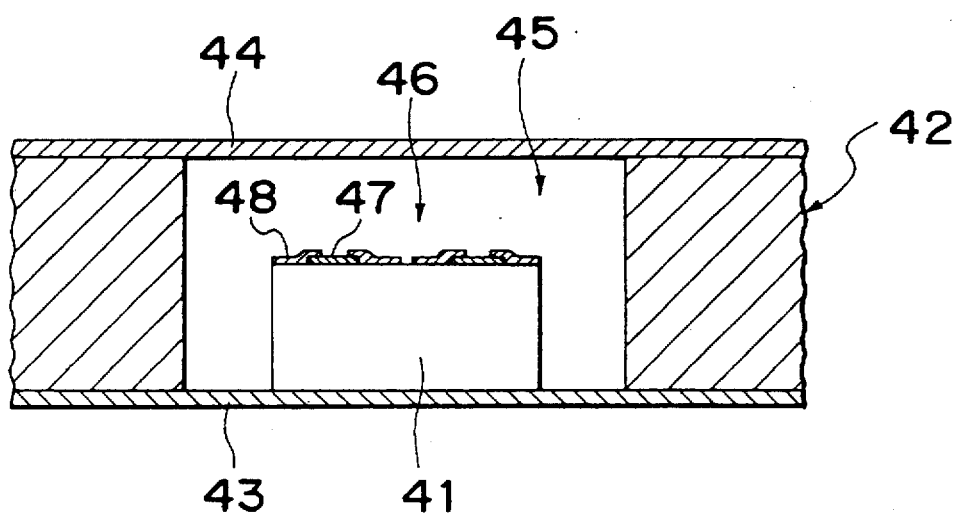
FIG. 8 is a sectional view showing a conventional package for packing an electronic chip component.

Since the mechanical strength of the organic protective film 4 is not sufficient to withstand the pressure applied by the ball 28 of the metal wire 27, it is easy to form the metal bump or bond a metal wire with the electronic chip component 12. The organic protective film 4 is preferably because a portion thereof corresponding to the portion of the electrode to be bonded easily can be destroyed, while the remaining portion of the surface of the electronic chip component 12 can remain covered by film 4, and the air barrier is maintained. Therefore, the electronic chip component is reliable in that the electrode 2 is maintained protected from and resistant to oxidation and moisture. In addition, even though the bonding wire, namely, the metal wire 27, contacts an edge portion 1a of the electronic chip component 12, the organic protective film 4 prevents the generation of a short circuit due to its electrical insulating properties. Thus, this feature facilitates the formation of the metal bump or the wire bonding, in addition to the electrode being protected from and resistant to moisture and oxidation. Another embodiment of the present invention is described below with reference to FIG. 6 showing a wafer 1, an electrode 2 and a metal bump disposed on the electrode 2 for connecting the electrode 2 with an external electrode. The periphery of the aluminum electrode 2 in the horizontal direction thereof and an exposed portion of the wafer 1 are covered with a 0.8 to 1.3 μm thick passivation film 3 made of silicon dioxide or silicon tetroxide so as to protect the wafer 1 from moisture. After the passivation film 3 is formed, polyimide solution is applied to the surface of the wafer 1 in the same thickness by spin coating so as to cover the surface of the metal bump 30, the exposed portion of the electrode 2, and the passivation film 3. Then, the polyimide solution is heated at 100° to 150° C. for one to three hours to harden the polyimide. Thus, the organic protective film 4 is formed. Thereafter, the wafer 1 is diced into a plurality of electronic chip components 31 (FIG. 7). The polyimide solution flows into any pin hole 5 in the passivation film 3, thus filling the pin hole 5. Thus, the organic protective film 4 covers the entire surface of the electronic chip component 31. Therefore, the surface of the electronic chip component 31 including the electrode 2 and the metal bump 30 is isolated and protected from the air.

Instead of polyimide, depending on the particular electronic chip component, the organic protection film 4 may be made of a thermosetting organic substance or a thermoplastic organic substance such as polyurethane, polyphenylene sulfide or epoxy resin having high electrical insulating properties and applied by a suitable film forming method or under suitable conditions.

FIG. 7 is a sectional view showing the electronic chip component 31 covered with the organic protective film 4 and having the metal bump 30 on the electrode 2 bonded with a TAB tape (Tape-Automatic-Bonding tape) 32. An inner lead 33 of the TAB tape 32 contacts the metal bump 30 formed on the electrode 2 of the electronic chip component 31 through the organic protective film 4. After the inner lead 33 contacts the metal bump 30, a contact portion 34 between the inner lead 33 and the metal bump 30 is heated by pulse current and compressed by means of a bonding tool. The mechanical strength of the organic protective film 4 is not sufficient to withstand the heat and the pressure. Therefore, the portion of the organic protective film 4 covering the contact portion 34 easily can be destroyed. As a result, the metal bump 30 is bonded under pressure with the inner lead 33. Instead of heat and pressure, a pulse method or a constant heating method may be used to bond under pressure the metal bump 30 and the inner lead 33 with each other.

The organic protective film 4 is preferable because it is easy to destroy a portion thereof, i.e. the portion at which the inner lead 33 and the metal bump 30 become bonded with each other, necessary for bonding while maintaining covered the remaining surface of the electronic chip component 31. Therefore, the electronic chip component is reliable in that the electrode 2 is protected from and resistant to oxidation and moisture. In addition, even if the inner lead 33 contacts an edge portion 31a of the electronic chip component 31, the organic protective film 4 prevents the generation of a short circuit due to its electrical insulating properties.

Instead of the TAB tape, a flip chip may be mounted on a normal circuit board.

Although the present invention has been fully described in connection with preferred embodiments thereof with reference to the accompanying drawings, it is to be noted that various changes and modifications will be apparent to those skilled in the art. Such changes and modifications are to be understood as being included within the scope of the present invention as defined by the appended claims unless they depart therefrom.

What is claimed is:

1. A method of bonding an external electrode to an electronic chip component including a wafer having an active surface, an electrode formed on a portion of said active surface, and a passivation film covering a portion of said active surface not covered by said electrode and a portion of said electrode, with another portion of said electrode not being covered by said passivation film, said method comprising:

providing an organic protective film covering entirely and providing an air barrier for said another portion of said electrode and said passivation film;

pressing said external electrode directly against a portion of said protective film covering said another portion of said electrode and thereby destroying locally only said portion of said protective film while not destroying any other area of said protective film and thereby maintaining said air barrier, thus bringing said external electrode into contact with said another portion of said electrode; and electrically and mechanically banding said external electrode to said another portion of said electrode.

2. A method as claimed in claim 1, wherein said external electrode comprises a metal wire having a ball at an end thereof, and said pressing comprises forcing said ball against said portion of said protective film.

3. A method as claimed in claim 2, further comprising holding said metal wire by a bonding tool.

4. A method as claimed in claim 3, comprising conducting said forcing by said bonding tool.

5. A method as claimed in claim 3, further comprising removing said metal wire from said ball, whereby said ball forms a bump on said electrode.

6. A method as claimed in claim 3, further comprising connecting said metal wire to a circuit board.

7. A method as claimed in claim 3, further comprising applying heat to said portion of said protective film.

8. A method as claimed in claim 3, further comprising applying ultrasonic energy to said portion of said protective film.

9. A method as claimed in claim 1, further comprising applying heat to said portion of said protective film.

10. A method as claimed in claim 1, further comprising applying ultrasonic energy to said portion of said protective film.

11. A method as claimed in claim 1, wherein said electrode includes a metal bump, and said external electrode comprises a TAB tape.

12. A method of packing an electronic chip component including a wafer having an active surface, an electrode formed on a portion of said active surface, and a passivation film covering a portion of said active surface not covered by said electrode and a portion of said electrode, with another portion of said electrode not being covered by said passivation film, said method comprising:

providing an organic protective film covering entirely and providing an air barrier for said another portion of said electrode and said passivation film;

providing a carrier tape main body having therethrough a hole defining an electronic chip component storage space having opposite ends opening onto opposite surfaces of said carrier tape main body;

covering a first end of said space with a first cover tape;

positioning said electronic chip component with said protective film in said space;

covering a second end of said space with a second cover tape to thereby retain said electronic chip component in said space; and whereby said protective film protects said active surface from being damaged or chipped during any subsequent movement of said electronic chip component within said space.

13. A method of fabrication employing an electronic chip component packed according to the method of claim 12, said method comprising removing said second cover tape, removing said electronic chip component from said space, and bonding an external electrode to the thus removed electronic chip component.

14. A method of fabrication as claimed in claim 13, wherein said bonding comprises pressing said external electrode directly against a portion of said protective film covering said another portion of said electrode and thereby destroying locally only said portion of said protective film while not destroying any other area of said protective film and thereby maintaining said air barrier, thus bringing said external electrode into contact with said another portion of said electrode, and electrically and mechanically bonding said external electrode to said another portion of said electrode.

15. A method of fabrication as claimed in claim 14, wherein said external electrode comprises a metal wire having a ball at an end thereof, and said pressing comprises forcing said ball against said portion of said protective film.

16. A method of fabrication as claimed in claim 15, further compiling holding said metal wire by a bonding tool.

17. A method of fabrication as claimed in claim 16, comprising conducting said forcing by said bonding tool.

18. A method of fabrication as claimed in claim 16, further comprising removing said metal wire from said ball, whereby said ball forms a bump on said electrode.

19. A method of fabrication as claimed in claim 16, further comprising connecting said metal wire to a circuit board.

20. A method of fabrication as claimed in claim 16, further compiling applying heat to said portion of said protective film.

21. A method of fabrication as claimed in claim 16, further comprising applying ultrasonic energy to said portion of said protective film.

22. A method of fabrication as claimed in claim 14, further comprising applying heat to said portion of said protective film.

23. A method of fabrication as claimed in claim 14, further comprising applying ultrasonic energy to said portion of said protective film.

24. A method of fabrication as claimed in claim 14, wherein said electrode includes a metal bump, and said external electrode comprises a TAB tape.

* * * * *